(12) United States Patent
Maruyama

(10) Patent No.: US 8,901,918 B2
(45) Date of Patent: Dec. 2, 2014

(54) LOAD CONNECTION STATE DETECTION CIRCUIT

(71) Applicant: ALPS Electric Co., Ltd., Tokyo (JP)

(72) Inventor: Takashi Maruyama, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 84 days.

(21) Appl. No.: 13/735,916

(22) Filed: Jan. 7, 2013

(65) Prior Publication Data

US 2013/0207642 A1 Aug. 15, 2013

(30) Foreign Application Priority Data

Feb. 13, 2012 (JP) ................... 2012-028586

(51) Int. Cl.
 *G01R 1/30* (2006.01)
 *G01R 1/20* (2006.01)
 *G01R 31/04* (2006.01)
(52) U.S. Cl.
 CPC ........ *G01R 1/206* (2013.01); *G01R 1/30* (2013.01); *G01R 31/043* (2013.01)
 USPC ................. 324/123 R; 324/76.11; 324/76.47; 324/76.55; 324/76.74; 324/76.82
(58) Field of Classification Search
 USPC ......... 324/123 R, 76.11, 76.47, 76.55, 76.74, 324/76.82, 104, 105, 130
 See application file for complete search history.

(56) References Cited

U.S. PATENT DOCUMENTS

| | | | | |
|---|---|---|---|---|
| 4,355,246 A | * | 10/1982 | Usui | 326/56 |
| 4,399,405 A | * | 8/1983 | Welzhofer | 714/735 |
| 4,535,258 A | * | 8/1985 | Tanizawa | 326/29 |
| 4,542,331 A | * | 9/1985 | Boyer | 323/313 |
| 5,598,405 A | * | 1/1997 | Hirose | 370/280 |
| 2002/0158681 A1 | * | 10/2002 | Yamamoto | 327/430 |
| 2007/0052865 A1 | * | 3/2007 | Suzuki et al. | 348/731 |

FOREIGN PATENT DOCUMENTS

| | | |
|---|---|---|
| JP | 11-155229 | 6/1999 |
| JP | 2009-118077 | 5/2009 |

* cited by examiner

*Primary Examiner* — Huy Q Phan
*Assistant Examiner* — Temilade S Rhoades-Vivour
(74) *Attorney, Agent, or Firm* — Beyer Law Group LLP

(57) ABSTRACT

This load connection state detection circuit includes a PNP type transistor whose emitter is connected to a power source terminal, a NPN type transistor where the emitter thereof is connected to the power source terminal, the collector thereof is connected to the base of the PNP type transistor, and the base thereof is connected to the collector of the PNP type transistor, and a diode inserted between the collector of the PNP type transistor and an external antenna load, wherein the diode is configured to perform temperature compensation for the base voltage of the NPN type transistor and prevent currents from flowing from the external antenna load to the PNP type transistor and the NPN type transistor.

3 Claims, 3 Drawing Sheets

LOAD CONNECTION STATE DETECTION CIRCUIT

CLAIM OF PRIORITY

This application claims benefit of Japanese Patent Application No. 2012-028586 filed on Feb. 13, 2012, which is hereby incorporated by reference.

BACKGROUND OF THE INVENTION

1. Field of the Invention

The present invention relates to a load connection state detection circuit detecting the connection state of a load such as an external antenna.

2. Description of the Related Art

In the past, in an on-vehicle GPS module, an external antenna receiving a signal from a satellite has been connected to an antenna terminal and used. In the on-vehicle GPS module, an antenna state detection circuit is used that detects whether or not the external antenna is normally connected. Such a technique is disclosed in, for example, Japanese Unexamined Patent Application Publication No. 2009-118077.

Such an antenna state detection circuit detects a current flowing through the external antenna connected to the antenna terminal serving as an output terminal, using a detection circuit, and outputs, as a 2-bit output signal, a detected result from a determination circuit to a signal processing circuit. In the signal processing circuit, on the basis of the 2-bit output signal from the antenna state detection circuit, it is determined whether or not the external antenna is adequately connected.

In addition, since, in the on-vehicle GPS module, the temperature change of a usage environment is great, there is made a proposal that a temperature compensation circuit used for correcting a circuit characteristic due to a temperature change is used. Such a technique is disclosed in, for example, Japanese Unexamined Patent Application Publication No. 11-155229.

Such a temperature compensation circuit includes a transistor and a diode whose anode is connected to the base of the transistor and whose cathode is grounded. Such a temperature compensation circuit, since a diode is used where the temperature characteristic of a forward voltage is closely related to the temperature characteristic of the base voltage of the transistor, it may be possible to reduce a difference in a voltage applied to the base of the transistor even if the temperature change has occurred. Accordingly, since it may be possible to reduce a change in a current value between the emitter and the collector of the transistor due to the temperature change, it may be possible to realize a temperature compensation function.

SUMMARY OF THE INVENTION

In an on-vehicle GPS module, when an external power source such as a car battery is erroneously connected to an antenna terminal, a circuit component in an antenna state detection circuit is likely to be damaged owing to an overcurrent from the car battery.

In view of such a point, the present invention is made, and provides a load connection state detection circuit capable of preventing a circuit component from being damaged owing to an overcurrent based on improper connection and obtaining a temperature compensation function without an increase in the number of components.

The present invention provides a load connection state detection circuit for a load through which a direct current is able to flow, the load being connected between an output terminal and a ground, the load connection state detection circuit including a first switch element whose one end is connected to a power source, a second switch element where one end thereof is connected to the power source or a ground, another end thereof is connected to a control end of the first switch element, and a control end thereof is connected to another end of the first switch element through a first resistor, and a diode inserted between the other end of the first switch element and the output terminal, a potential difference between both ends of the diode changing owing to a temperature, wherein the diode performs temperature compensation for a voltage value in the control end of the second switch element and prevents currents from flowing from the output terminal into the first and second switch elements when an external voltage is applied to the output terminal.

According to this configuration, since, using the diode, it may be possible to prevent overcurrents from flowing from the output terminal into the first switch element and the second switch element, it may be possible to prevent a circuit component from being damaged owing to the overcurrents. In addition, since a voltage subjected to temperature compensation owing to the diode is applied to the control end of the second switch element, a voltage subjected to temperature compensation is applied to the control end of the second switch element. Accordingly, since the diode used for temperature compensation also functions as an element for preventing an overcurrent, it may be possible to suppress an increase in the number of components.

In addition, in the present invention, the load connection state detection circuit may include a second resistor where one end thereof is connected to the control end of the second switch element and another end thereof is connected to a ground, and a third resistor inserted between a power source and the one end of the first switch element, wherein, owing to a combined potential of an electric potential due to the resistance values of the first and second resistors, a voltage difference between both ends of the third resistor, and an electric potential the diode has, an electric potential may be applied to the control end of the second switch element. According to this configuration, it may be possible to adjust the voltage applied to the control end of the second switch element on the basis of the resistance values of the first resistor, the second resistor, and the diode.

In addition, in the present invention, the load connection state detection circuit may include an amplifying circuit where one input terminal is connected to one end side of the third resistor and another input terminal is connected to the other end side of the third resistor, the amplifying circuit amplifying a voltage difference between both ends of the third resistor, wherein a fourth resistor may be connected between both ends of the first switch element, the first switch element may be configured using a PNP type transistor, the second switch element may be configured using an NPN type transistor, an emitter of the PNP type transistor may be connected to the other end of the third resistor, a collector of the NPN type transistor may be connected to a base of the PNP type transistor through a fifth resistor, a base of the NPN type transistor may be connected to a collector of the PNP type transistor though the first resistor, a cathode of the diode may be connected to the output terminal, and an anode thereof may be connected to the collector of the PNP type transistor.

In addition, in the present invention, in the load connection state detection circuit, an antenna circuit may be connected to the output terminal.

According to the present invention, it may be possible to realize a load connection state detection circuit capable of preventing a circuit component from being damaged owing to an overcurrent based on improper connection and obtaining a temperature compensation function without an increase in the number of components.

DESCRIPTION OF THE PREFERRED EMBODIMENTS

Hereinafter, one embodiment of the present invention will be described in detail with reference to accompanying drawings.

Figure 1:
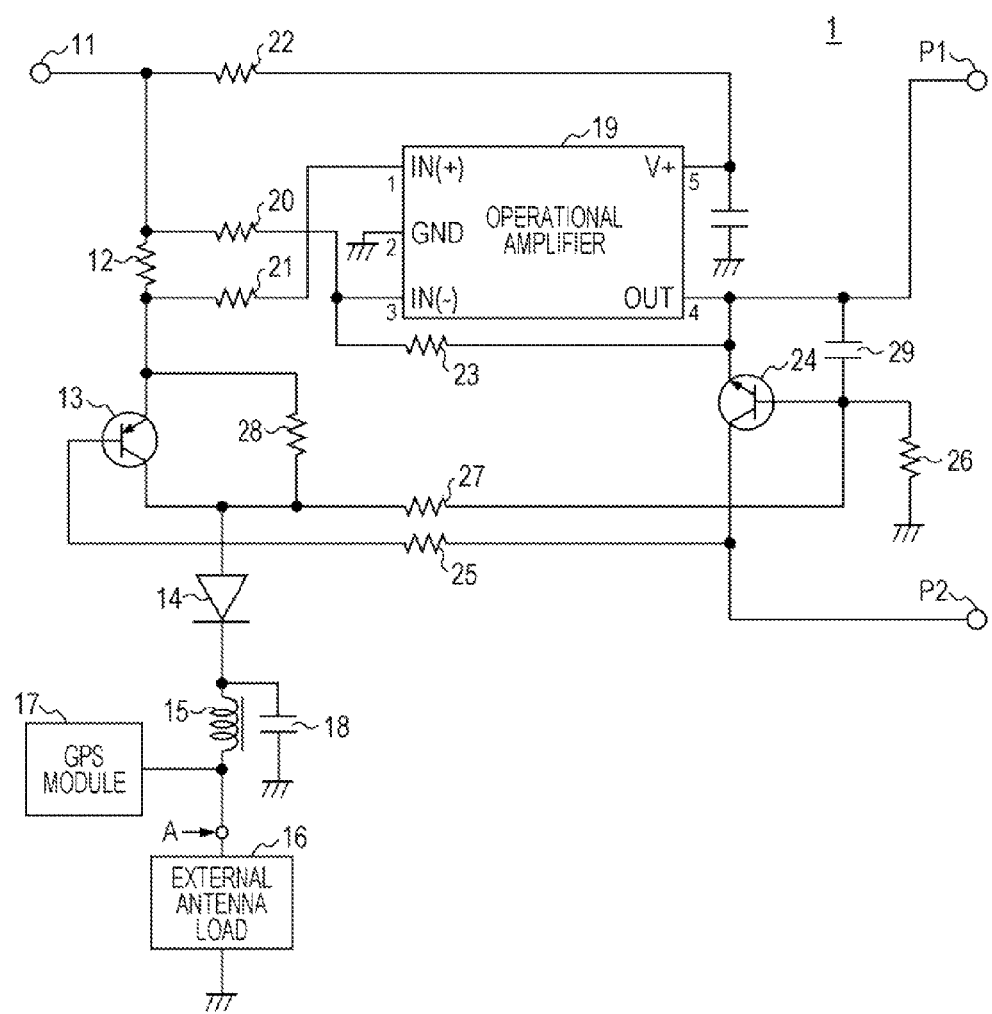
FIG. 1 is a configuration diagram of a load connection state detection circuit according to the present embodiment.

FIG. 1 is the configuration diagram of a load connection state detection circuit 1 according to the present embodiment. As illustrated in FIG. 1, the emitter of a PNP type transistor 13 (first switch element) is connected, through a resistor element 12 (third resistor) used for detecting a current, to a power source terminal 11 (power source) to which a power source voltage (for example, DC 5 V) is applied. The collector of the PNP type transistor 13 is connected to the anode of a diode 14 used for both reverse bias prevention and temperature compensation (hereinafter, simply referred to as the "diode 14"). The cathode of the diode 14 is connected to an antenna terminal A (output terminal) through an inductor 15 serving as a high-frequency choke. An external antenna load 16 (antenna circuit) is connected to the antenna terminal A.

A GPS module 17 is connected to a connection point between the antenna terminal A and the inductor 15. A capacitor 18 used for a bypass is connected between a ground and a connection point between the inductor 15 and the cathode of the diode 14.

An input terminal (third terminal) on the minus side of an operational amplifier 19 is connected to one end on the power source terminal 11 side of a resistor element 12 through a resistor element 20, and an input terminal (first terminal) on the plus side of the operational amplifier 19 is connected to the other end on the PNP type transistor 13 side of the resistor element 12 through a resistor element 21. The output terminal (fourth terminal) of the operational amplifier 19 is connected to a first output terminal P1, and connected to the emitter of an NPN type transistor 24 (second switch element). In the operational amplifier 19, a power source terminal (fifth terminal) is connected to the power source terminal 11 through a resistor element 22, and a resistor element 23 serving as a feedback resistor is connected between the output terminal (fourth terminal) and the input terminal (third terminal) on the minus side.

The operational amplifier 19 outputs, to the first terminal P1, an output signal obtained by amplifying a voltage difference between both ends of the resistor element 12. In the present embodiment, the power source voltage of the power source terminal 11 is applied to the input terminal on the minus side of the operational amplifier 19 without passing through the resistor element 12, and the power source voltage is applied to the input terminal on the plus side of the operational amplifier 19 through the resistor element 12. Therefore, in a state where a normal current flows through the external antenna load 16 owing to the power source voltage applied to the power source terminal 11 (hereinafter, referred to as an "antenna normal state"), a voltage difference greater than or equal to a predetermined value occurs between both ends owing to a voltage drop due to the resistor element 12. When the voltage difference greater than or equal to the predetermined value has occurred between both ends of the resistor element 12, the operational amplifier 19 amplifies and outputs the voltage difference. In the case of the circuit configuration illustrated in FIG. 1, since a high potential side is connected to the input terminal on the minus side of the operational amplifier 19, an amplified output at the time of amplifying the voltage difference greater than or equal to the predetermined value becomes a low level output (L output). In addition, in the operational amplifier 19, when the voltage difference occurring between the both ends of the resistor element 12 is smaller than the predetermined value, the amplified output becomes a zero level output (H output).

In addition, in a state where the external antenna load 16 is not connected to the antenna terminal A (hereinafter, referred to as an "antenna-open state"), since a load put on the voltage power source of the power source terminal 11 is not connected, just a slight current flows through the resistor element 12. Accordingly, there is little voltage drop due to the resistor element 12, and since the voltage difference occurring between both ends of the resistor element 12 become less than or equal to the predetermined value, the amplified output of the operational amplifier 19 becomes the H output.

Furthermore, in a state where, while the external antenna load 16 is connected to the antenna terminal A, the external antenna load 16 is short-circuited (hereinafter, referred to as an "antenna-short-circuit state"), almost the same current is set to flow through the external antenna load 16, compared with the antenna normal state. The description will be performed with, for example, assuming that a current flowing through the resistor element 12 is 10 mA at the time of the antenna-short-circuit state. At this time, it is assumed that each parameter is set so that the operational amplifier 19 becomes the L output when a voltage difference is input that is due to a voltage drop at the time of a current greater than or equal to 3 mA flowing through the resistor element 12 and the operational amplifier 19 becomes the H output when a voltage difference is input that is due to a voltage drop at the time of a current smaller than 3 mA flowing. Accordingly, in the "antenna-short-circuit state", the operational amplifier 19 amplifies the voltage difference between both ends of the resistor element 12 and becomes the L output.

The collector of the NPN type transistor 24 is connected to a second output terminal P2, and connected to the base of the PNP type transistor 13 through a resistor element 25 (first resistor). The base of the NPN type transistor 24 is grounded through a resistor element 26 (second resistor), and connected to the anode of the diode 14 through a resistor element 27 (fifth resistor). In the present embodiment, the anode voltage of the diode 14 is applied to the base of the NPN type transistor 24. Therefore, a voltage subjected to temperature compensation owing to the diode 14 is applied to the base of the NPN type transistor 24. Accordingly, it may be possible to realize the temperature compensation function of the NPN type transistor 24 due to the diode 14.

In addition, in the present embodiment, the diode 14 is provided on a path where the PNP type transistor 13 and the NPN type transistor 24 are connected to the antenna terminal A. Specifically, the anode of the diode 14 is connected to the collector of the PNP type transistor 13, and connected to the base of the NPN type transistor 24. Accordingly, since it may be possible to prevent overcurrents from flowing from the antenna terminal A to the PNP type transistor 13 and the NPN type transistor 24 even if a car battery or the like is erroneously connected to the antenna terminal A, it may be possible to prevent the load connection state detection circuit 1 from being damaged. In this way, in the present embodiment, since the voltage subjected to temperature compensation is applied to the base of the NPN type transistor 24 owing to the diode 14 and overcurrents from the antenna terminal A are prevented, it may not be necessary to separately provide a diode used for a temperature compensation function in addition to a diode used for overcurrent prevention. Accordingly, it may be possible to prevent the circuit component from being damaged owing to the overcurrent without an increase in the number of components and realize the temperature compensation function.

A resistor element 28 (fourth resistor) is connected between the emitter and the collector of the PNP type transistor 13. In addition, a capacitor 29 used for a bypass is connected between the base of the NPN type transistor 24 and the output terminal of the operational amplifier 19. The "H output" or "L output" of the operational amplifier 19 is applied to the base of the PNP type transistor 13 through the emitter and collector of the NPN type transistor 24. In the "L output", the emitter and the collector of the PNP type transistor 13 are conductively connected to each other. By the emitter and the collector of the PNP type transistor 13 being conductively connected to each other, the power source voltage is applied from the power source terminal 11 to the external antenna load 16 through the emitter and the collector of the PNP type transistor 13.

In response to the connection state of the external antenna load 16, a current flowing through the external antenna load 16 owing to the power source voltage changes. As a result, a voltage difference corresponding to the connection state occurs between both ends of the resistor element 12, and the operational amplifier 19 amplifies that voltage difference and supplies the "L output" or the "H output" to the first terminal P1. In addition, in the anode of the diode 14, a voltage emerges that is obtained by voltage-dividing the power source voltage owing to the combined resistance of the resistor elements 12 and 28 and the combined resistance of the diode 14 and the external antenna load 16. In response to the connection state of the external antenna load 16, the voltage emerging in the anode of the diode 14 changes, and that voltage is applied to the base of the NPN type transistor 24. As a result, in response to the connection state of the external antenna load 16, a voltage between the base and the emitter of the NPN type transistor 24 changes, and switching between conduction and non-conduction between the base and the emitter of the NPN type transistor 24 is performed.

Next, an example of the operation of the load connection state detection circuit 1 configured in such a way as described above will be described.

In the "antenna normal state", the power source voltage (for example, DC 5 V) of the power source terminal 11 is applied to the external antenna load 16 through the resistor element 12, the resistor element 28, the diode 14, and the inductor 15, and a direct current corresponding to a voltage difference between the antenna terminal A and the ground flows through the external antenna load 16. In the present embodiment, since the collector of the PNP type transistor 13 is connected to the anode of the diode 14 and the cathode of the diode is connected to the external antenna load 16 side, even if a power source such as a car battery is erroneously connected to the antenna terminal A, it may be possible to prevent overcurrents from flowing from the car battery to the PNP type transistor 13 and the NPN type transistor 24, owing to the diode 14, and it may be possible to suppress the damage of the load connection state detection circuit 1.

While, as described above, the voltage emerging in the anode of the diode 14 is voltage-divided owing to the resistor elements 12 and 28, the diode 14, and the like, and applied to the base of the NPN type transistor 24, the output of the operational amplifier 19 becomes the "L output" owing to a current flowing through the resistor element 12. Therefore, a voltage difference between the base and the emitter of the NPN type transistor 24 becomes greater than or equal to a predetermined value, and the emitter and the collector are conductively connected to each other. Since a path going from the power source terminal 11 through the resistor element 12 and the emitter and the base of the PNP type transistor 13 and further passing though the resistor element 25 and the collector and the emitter of the NPN type transistor 24 is grounded at the output end of the operational amplifier 19 having become the "L output", the PNP type transistor 13 is put into a conduction state.

In this way, in the "antenna normal state", the L output of the operational amplifier 19 is supplied to the first output terminal P1, and supplied to the second output terminal P2 through the emitter and the collector of the NPN type transistor 24. As a result, the "L output" emerges in each of the first output terminal P1 and the second output terminal P2. A subsequent-stage circuit determines whether the output of each of the first output terminal P1 and the second output terminal P2 is L or H, and hence, it may become possible to detect the "antenna normal state". In other words, if, in the subsequent-stage circuit, it is determined that the first output terminal P1 is the L output and the second output terminal P2 is the L output, being in the "antenna normal state" turns out to be detected.

In the "antenna-open state", the external antenna load 16 is not connected to the antenna terminal A. When the antenna terminal A is in an open state, since a current slightly flows through the resistor element 12, a voltage difference between both ends of the resistor element 12 becomes minute. As a result, the amplified output of the operational amplifier 19 becomes zero, and the H output emerges in the output terminal. The H output of the operational amplifier 19 is supplied to the first output terminal P1.

On the other hand, a voltage obtained by voltage division due to the combined resistance of the resistor elements 12, 28, and 27 and the resistor element 26 is applied to the base of the NPN type transistor 24. Since the H output of the operational amplifier 19 is applied to the emitter of the NPN type transistor 24, the emitter and the base of the NPN type transistor 24 become almost the same electric potential or inversely biased with respect to each other.

In this way, in the "antenna-open state", since the external antenna load 16 is not connected to the antenna terminal A, the emitter and the base of the NPN type transistor 24 become almost the same electric potential or inversely biased with respect to each other. Accordingly, a non-conduction state occurs between the emitter and the base of the NPN type transistor 24. Accordingly, since the power source voltage is applied to the collector of the NPN type transistor 24 with going from the power source terminal 11 through the resistor element 12, the emitter and the base of the PNP type transistor 13, and the resistor element 25, the second output terminal P2 becomes the H output. As a result, the "H output" emerges in each of the first output terminal P1 and the second output terminal P2. A subsequent-stage circuit determines whether the output of each of the first output terminal P1 and the second output terminal P2 is L or H, and hence, it may become possible to detect the "antenna-open state". In other words, if, in the subsequent-stage circuit, it is determined that the first output terminal P1 is the H output and the second output terminal P2 is the H output, being in the "antenna-open state" turns out to be detected.

Since, in the "antenna-short-circuit state", the external antenna load 16 connected to the antenna terminal A is short-circuited, almost the same current (for example, 10 mA) flows through the resistor element 12, compared with the "antenna normal state". At this time, in the present embodiment, the resistance value of the resistor element 12 is set so that the output signal of the operational amplifier 19 in the "antenna-short-circuit state" becomes the "L output". Therefore, the operational amplifier 19 amplifies a voltage difference between both ends of the resistor element 12, and the "L output" is supplied from the output terminal to the first output terminal P1.

On the other hand, while a voltage is obtained by voltage-dividing the power source voltage from the power source terminal 11 owing to combined resistance due to the resistor element 12 and the resistor element 28, the diode 14, and the external antenna load 16 and the voltage is further voltage-divided owing to the resistor elements 27 and 26 and applied to the base of the NPN type transistor 24, since the external antenna load 16 is in a state of being extremely small, a voltage large enough to put the NPN type transistor 24 into a conduction state does not occur.

In this way, in the "antenna-short-circuit state", since the external antenna load 16 is short-circuited, the NPN type transistor 24 is not put into a conduction state while the operational amplifier 19 becomes the L output. Accordingly, while the "L output" is supplied to the first output terminal P1, the second output terminal P2 becomes the "H output". The subsequent-stage circuit determines whether the output of each of the first output terminal P1 and the second output terminal P2 is L or H, and hence, it may become possible to detect the "antenna-short-circuit state". In other words, if, in the subsequent-stage circuit, it is determined that the first output terminal P1 is the L output and the second output terminal P2 is the H output, being in the "antenna-short-circuit state" turns out to be detected.

Figure 2:
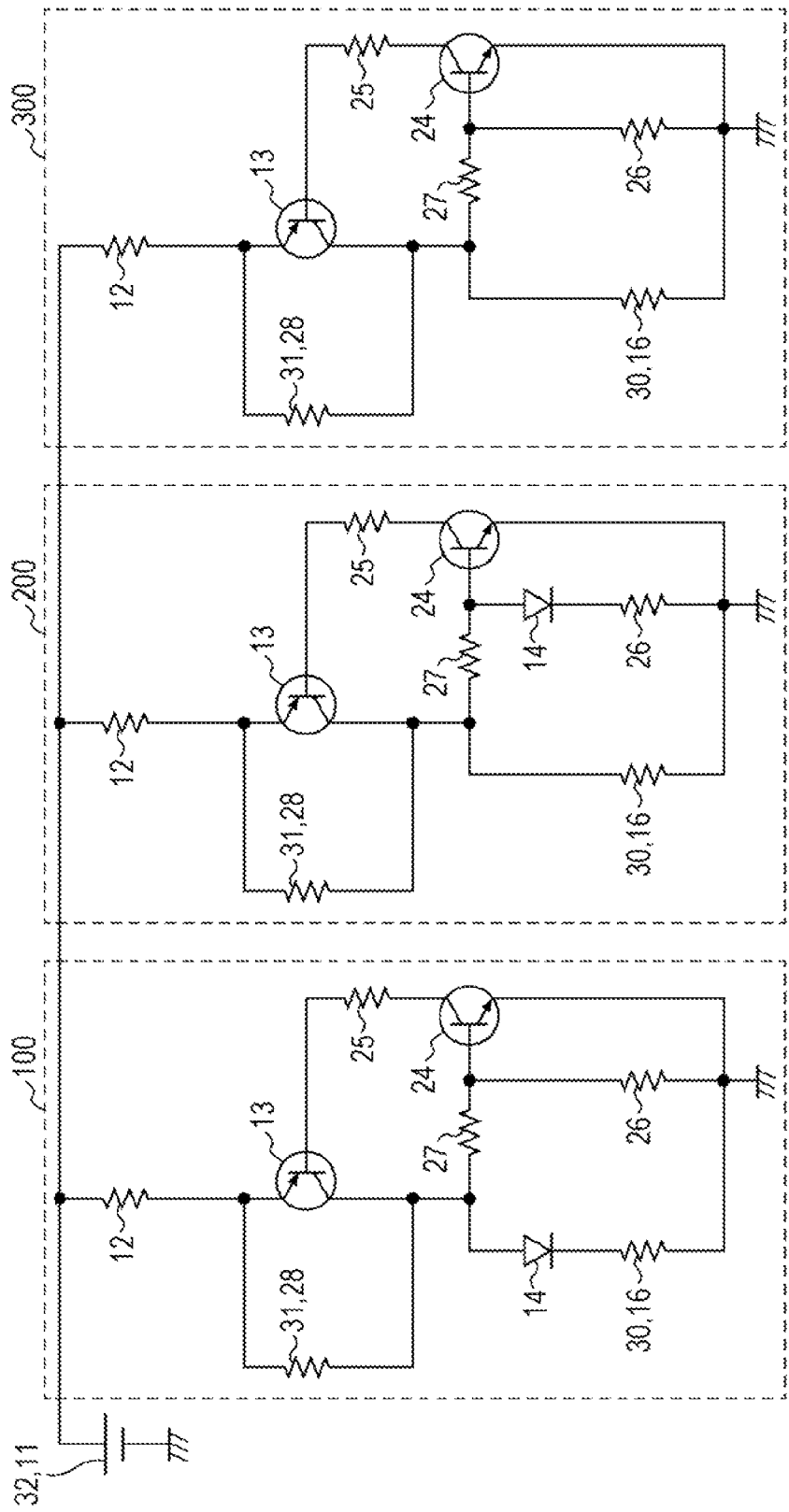
FIG. 2 is configuration diagrams of three types of model circuits used for simulation according to the present embodiment.
Figure 3:
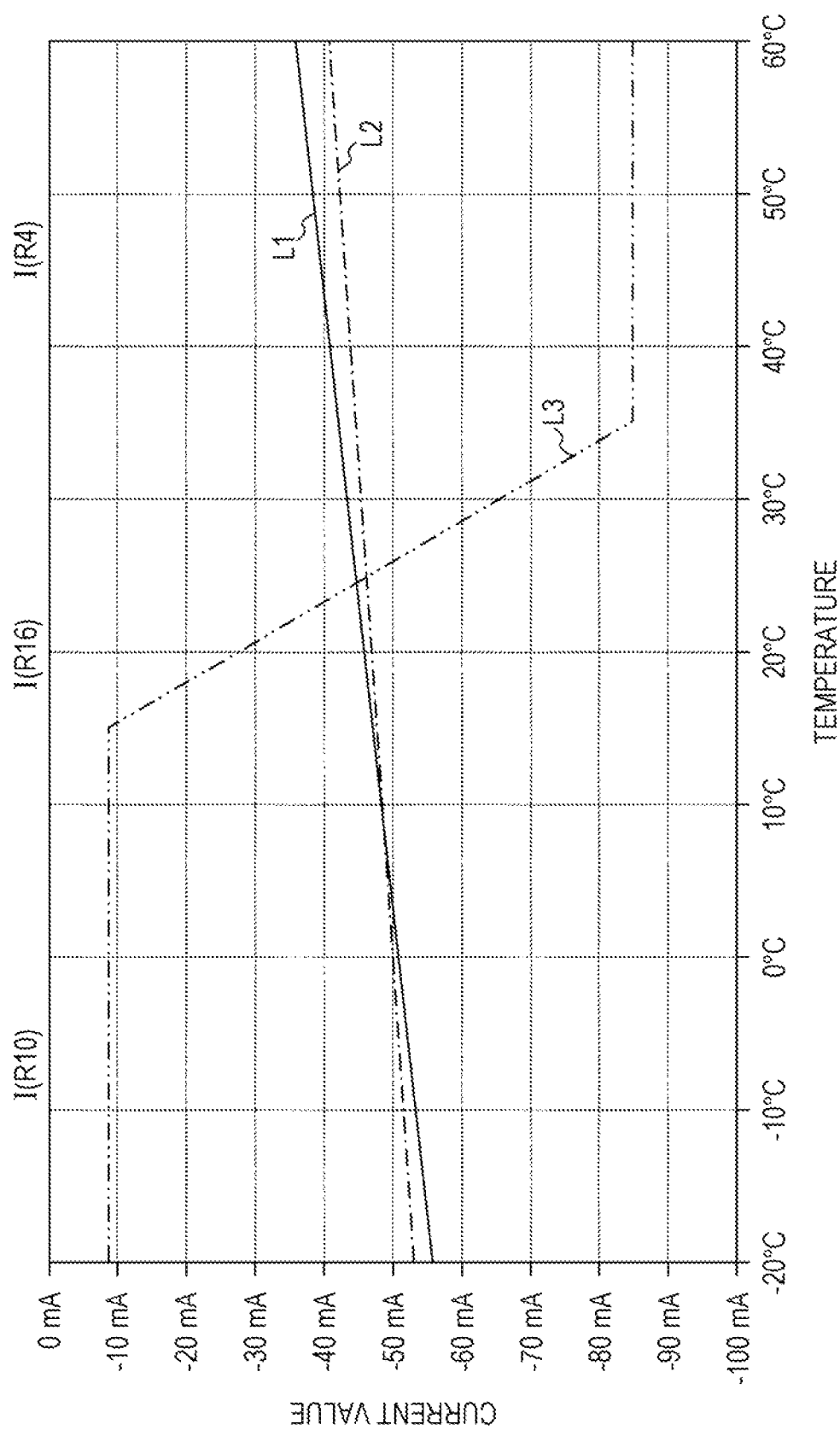
FIG. 3 is a diagram illustrating a simulation result according to the present embodiment.

Next, the simulation result of temperature compensation functions utilizing three types of model circuits will be described. FIG. 2 and FIG. 3 illustrate the simulation result of the temperature compensation functions utilizing a model circuit 100 corresponding to the load connection state detection circuit 1 according to the present embodiment, a model circuit 200 serving as a comparative example, and a model circuit 300 serving as an example of the related art. FIG. 2 illustrates the configuration diagrams of the three types of model circuits used for simulation. FIG. 3 is a diagram illustrating the simulation result, and illustrates a relationship between a temperature and the current value of the external antenna load 16. In addition, in FIG. 3, the current value of the external antenna load 16 is illustrated in a vertical axis, and the temperature is illustrated in a horizontal axis.

As illustrated in FIG. 2, in the model circuit 100 of the load connection state detection circuit 1 according to the present embodiment, a resistor element 30 represents the external antenna load 16, and a resistor element 31 represents the resistor element 28. In addition, as a power source voltage supplied to the power source terminal 11, a direct-current power source 32 is connected. Since the other configuration is the same as the load connection state detection circuit 1 illustrated in FIG. 1, a same simple is assigned to a same configuration element, and the redundant description thereof will be avoided.

In the model circuit 100, the base of the NPN type transistor 24 is grounded through the resistor element 26, and connected to the anode of the diode 14 through the resistor element 27. Therefore, a power source voltage is applied to the base of the NPN type transistor 24, the power source voltage being subjected to temperature compensation owing to the diode 14 used for temperature compensation where a voltage between the anode and the cathode thereof changes in response to a temperature change. Accordingly, as illustrated in FIG. 3, it is understood that even if a temperature changes from −20° C. to 60° C., it may also be possible to suppress the amount of change in the value of a current flowing through the external antenna load 16 to about 20 mA (refer to a solid line L1 in FIG. 3) and it may be possible to realize a temperature compensation function.

In the model circuit 200 according to the comparative example, the base of the NPN type transistor 24 is connected to the anode of the diode 14, and the cathode of the diode 14 is grounded through the resistor element 26. Therefore, a power source voltage is applied to the base of the NPN type transistor 24, the power source voltage being subjected to temperature compensation owing to the diode 14 used for temperature compensation, in the same way as the model circuit 100 according to the present embodiment. Accordingly, as illustrated in FIG. 3, it is understood that, in the same way as the model circuit 100, it may be possible to realize a temperature compensation function (refer to a dashed-dotted line L2 in FIG. 3).

In the model circuit 300 according to an example of the related art, the base of the NPN type transistor 24 is grounded through the resistor element 26. Therefore, as illustrated in FIG. 3, in the model circuit 300 according to an example of the related art, it is understood that, in a range from a temperature of about 15° C. to a temperature of about 35° C., the value of a current flowing between the emitter and the collector of the NPN type transistor 24 rapidly fluctuates and it may be difficult to realize a temperature compensation function (refer to a two-dot chain line L3 in FIG. 3).

As described above, according to the present embodiment, it may become possible to detect the state of the connection of the external antenna load 16 to the antenna terminal A on the basis of the combination of the L output/H output supplied to the first output terminal P1 and the second output terminal P2. In addition, since the diode 14 is connected to the external antenna terminal A in an inverse direction, even if the car battery or the like is erroneously connected to the antenna terminal A, it may be possible to prevent an overcurrent and it may be possible to prevent the load connection state detection circuit 1 from being damaged. Furthermore, since the power source voltage subjected to temperature compensation owing to the diode 14 is applied to the base of the NPN type transistor 24, it may be possible to realize the temperature compensation function due to the diode 14.

In addition, the present invention is not limited to the above-mentioned embodiment. For example, while, in the above-mentioned embodiment, a case is described where the PNP type transistor 13 is used as the first switch element and the NPN type transistor 24 is used as the second switch element, other switch elements may also be used as the first switch element and the second switch element. In addition, while, in the above-mentioned embodiment, a case is described where the external antenna load 16 serving as a load is connected to the antenna terminal A serving as the output terminal, the load connected to the output terminal is not limited to the external antenna load 16, and modifications may arbitrarily occur.

The present invention is useful as a load connection state detection circuit detecting the state of the connection of a load to a terminal to which an on-vehicle GPS module is connected.

What is claimed is:

1. A circuit for detecting a load connection state of a load connected between an output terminal and a ground, the load allowing a direct current to flow therethrough, comprising:
 a first switch element having a first end connected to a power source, a second end; and a control end;
 a second switch element having a first end connected to the power source or the ground, a second end connected to the control end of the first switch element, and a control end connected to the second end of the first switch element through a first resistor;
 a diode provided between the second end of the first switch element and the output terminal, a potential difference between both ends of the diode changing due to a temperature change,
 a second resistor connected between the control end of the second switch element and the ground; and
 a third resistor connected between the power source and the first end of the first switch element,
 wherein the diode performs temperature compensation for a voltage value in the control end of the second switch element while preventing a current from flowing from the output terminal into the first and second switch elements when an external voltage is applied to the output terminal,
 and wherein an electric potential applied to the control end of the second switch element is a combined potential including respective electric potentials due to the first and second resistors, a voltage difference between both ends of the third resistor, and an electric potential of the diode.

2. The load connection state detection circuit according to claim 1, further comprising:
 an amplifying circuit having a first input terminal is connected to a first end of the third resistor and a second input terminal connected to a second end of the third resistor, the amplifying circuit amplifying the voltage difference between the first and second ends of the third resistor; and
 a fourth resistor connected between the first and second ends of the first switch element,
 wherein the first switch element includes a PNP type transistor having an emitter connected to the first end of the third resistor, a collector, and a base,
 wherein the second switch element includes an NPN type transistor having a collector connected to the base of the PNP type transistor through a fifth resistor, a base connected to the collector of the PNP type transistor though the first resistor, and
 wherein the diode has a cathode connected to the output terminal, and an anode connected to the collector of the PNP type transistor.

3. The load connection state detection circuit according to claim 1, wherein the load is an antenna circuit.

* * * * *